United States Patent
Masuda

(10) Patent No.: US 7,141,493 B2
(45) Date of Patent: Nov. 28, 2006

(54) SEMICONDUCTOR DEVICE, METHOD OF MANUFACTURING THREE-DIMENSIONAL STACKING TYPE SEMICONDUCTOR DEVICE, CIRCUIT BOARD, AND ELECTRONIC INSTRUMENT

(75) Inventor: Kazuhiro Masuda, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 208 days.

(21) Appl. No.: 10/799,621

(22) Filed: Mar. 15, 2004

(65) Prior Publication Data

US 2004/0207089 A1 Oct. 21, 2004

(30) Foreign Application Priority Data

Mar. 27, 2003 (JP) ............................. 2003-088825
Dec. 22, 2003 (JP) ............................. 2003-424713

(51) Int. Cl.
*H01L 21/4763* (2006.01)

(52) U.S. Cl. ................................. 438/618; 257/E77.44

(58) Field of Classification Search ................ 438/15, 438/104, 107–114, 118–119, 121–123, 125–129, 438/135, 142, 145–149, 151, 157, 176, 614–615, 438/637, 667, 406, 455, 456–460, 597–599, 438/620

See application file for complete search history.

(56) References Cited

U.S. PATENT DOCUMENTS

| | | | |
|---|---|---|---|
| 6,608,371 B1 | 8/2003 | Kurashima et al. | |
| 6,943,056 B1 * | 9/2005 | Nemoto | 438/106 |
| 6,962,865 B1 * | 11/2005 | Hanaoka et al. | 438/618 |
| 6,964,887 B1 * | 11/2005 | Akagawa | 438/126 |
| 6,995,455 B1 * | 2/2006 | Nemoto et al. | 257/621 |
| 2002/0025587 A1 * | 2/2002 | Wada | 438/15 |
| 2002/0046880 A1 * | 4/2002 | Takubo et al. | 174/261 |
| 2004/0251554 A1 | 12/2004 | Masuda | |
| 2005/0042786 A1 * | 2/2005 | Bieck et al. | 438/38 |

FOREIGN PATENT DOCUMENTS

JP A 2002-50738 2/2002

OTHER PUBLICATIONS

I. Miyazawa et al., "Development of Die Level Stacked Packaging", *2003 ICEP Official Program*, Apr. 16-18, 2003.

* cited by examiner

Primary Examiner—Michael Lebentritt
Assistant Examiner—Andre' Stevenson
(74) Attorney, Agent, or Firm—Oliff & Berridge, PLC

(57) ABSTRACT

A semiconductor device has a substrate and an electrode layer formed on the substrate, and the electrode layer includes a plurality of conductive layers and an insulating layer which are stacked, the insulating layer being interposed between two of the conductive layers adjacent each other, a through-hole being formed in each of the conductive layers lower than an uppermost conductive layer among the conductive layers, and the through-hole being filled with an insulating material.

1 Claim, 9 Drawing Sheets

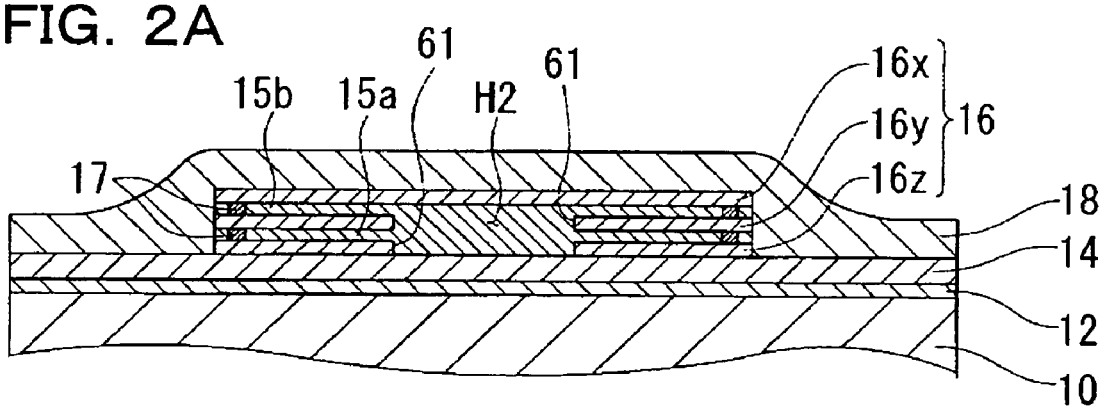
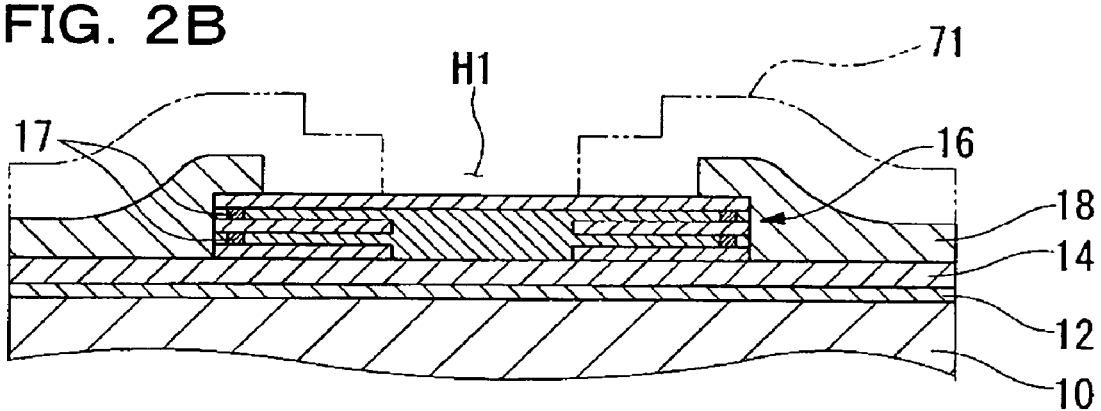
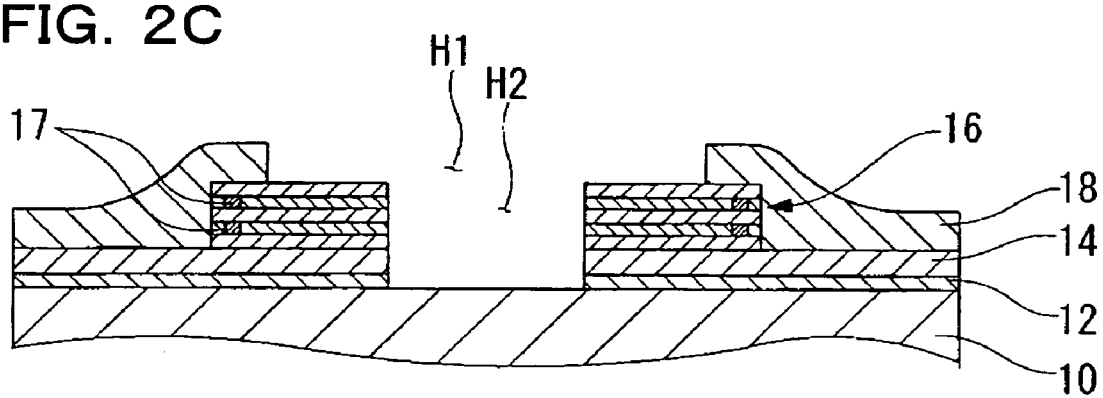

SEMICONDUCTOR DEVICE, METHOD OF MANUFACTURING THREE-DIMENSIONAL STACKING TYPE SEMICONDUCTOR DEVICE, CIRCUIT BOARD, AND ELECTRONIC INSTRUMENT

Japanese Patent Application No. 2003-88825, filed on Mar. 27, 2003 and Japanese Patent Application No. 2003-424713, filed on Dec. 22, 2003, are hereby incorporated by reference in their entirety.

BACKGROUND OF THE INVENTION

The present invention relates to a semiconductor device, a method of manufacturing a three-dimensional stacking type semiconductor device, a circuit board, and an electronic instrument. More particularly, the present invention relates to a semiconductor device having a configuration suitable for a three-dimensional stacking technology.

In order to reduce the size and weight of a portable electronic instrument such as a portable telephone, a notebook-type personal computer or a personal data assistant (PDA), various electronic parts such as a semiconductor chip provided in the electronic instrument have been reduced in size. Moreover, the space for mounting the electronic parts is extremely limited. Therefore, the package form of the semiconductor chip has been developed, and an extremely small package called a chip scale package (CSP) has been proposed.

Since the mounting area of the semiconductor chip manufactured by using the CSP technology is approximately equal to the area of the semiconductor chip, high-density mounting can be achieved.

However, since the electronic instrument is expected to be further reduced in size and increased in function in the future, it is necessary to increase the mounting density of the semiconductor chip.

In view of the above situation, a three-dimensional stacking technology as disclosed in Japanese Patent Application Laid-open No. 2002-50738 has been proposed. This three-dimensional stacking technology achieves high-density mounting of semiconductor chips by stacking semiconductor chips having the same function or by stacking semiconductor chips having different functions, and interconnecting the semiconductor chips.

In the above-described three-dimensional stacking technology, the technology for interconnecting the semiconductor chips is extremely important. In order to allow the semiconductor device including a plurality of semiconductor chips to exhibit expected functions, interconnects must be formed conforming to the design, and reliability of the semiconductor device must be secured by securing the connection between the semiconductor chips.

A semiconductor chip used for the three-dimensional stacking technology has an electrode structure in which electrodes are formed on the upper and back surfaces of the semiconductor substrate, a through-hole is formed through the upper and back surfaces of the semiconductor substrate, and the upper and lower electrodes are electrically connected through the through-hole. The electrode formed on the back surface of one semiconductor chip is connected with the electrode formed on the upper surface of another semiconductor chip by stacking the semiconductor chips having such an electrode structure, whereby the semiconductor chips are interconnected.

In such a semiconductor device, the connection state, that is, the electrical connection state between the electrodes, is an important factor in securing reliability of the semiconductor device. In the case where an electrical connection failure occurs, malfunction may occur in the semiconductor device.

Therefore, in the case of stacking a plurality of electrode layers through insulating layers in order to prevent removal of the electrode, a through-hole must be formed in the electrode layers and the insulating layers, and a connection terminal must be inserted into the through-hole. However, the etching step of the electrode layers and the insulating layers is complicated, in which the etching conditions may be changed for each layer.

BRIEF SUMMARY OF THE INVENTION

An aspect of the present invention relates to a semiconductor device including a substrate and an electrode layer formed on the substrate, wherein the electrode layer includes a plurality of conductive layers and an insulating layer which are stacked, the insulating layer being interposed between two of the conductive layers adjacent each other, a through-hole being formed in each of the conductive layers lower than an uppermost conductive layer among the conductive layers, and the through-hole being filled with an insulating material.

Another aspect of the present invention relates of a method of manufacturing a three-dimensional stacking type semiconductor device using the above semiconductor device, the method including:

a semiconductor device formation step which includes an electrode layer through-hole formation step of forming a hole in the uppermost conductive layer coaxially with the through-hole in each of the conductive layers lower than the uppermost conductive layer, and forming an electrode layer through-hole in the electrode layer by etching the insulating material, a step of forming a substrate through-hole connected with the electrode layer through-hole in the substrate, and a step of filling the electrode layer through-hole and the substrate through-hole with a conductive member; and a semiconductor device stacking step of stacking a plurality of the semiconductor devices by using a conductive member of each of the semiconductor devices.

A circuit board according to a further aspect of the present invention has the above semiconductor device. An electronic instrument according to a still further aspect of the present invention has the above electronic instrument.

BRIEF DESCRIPTION OF THE SEVERAL VIEWS OF THE DRAWING

FIGS. 2A to 2C are cross-sectional schematic diagrams showing steps in a manufacturing process of the semiconductor device shown in FIG. 1.

DETAILED DESCRIPTION OF THE EMBODIMENT

Figure 1:
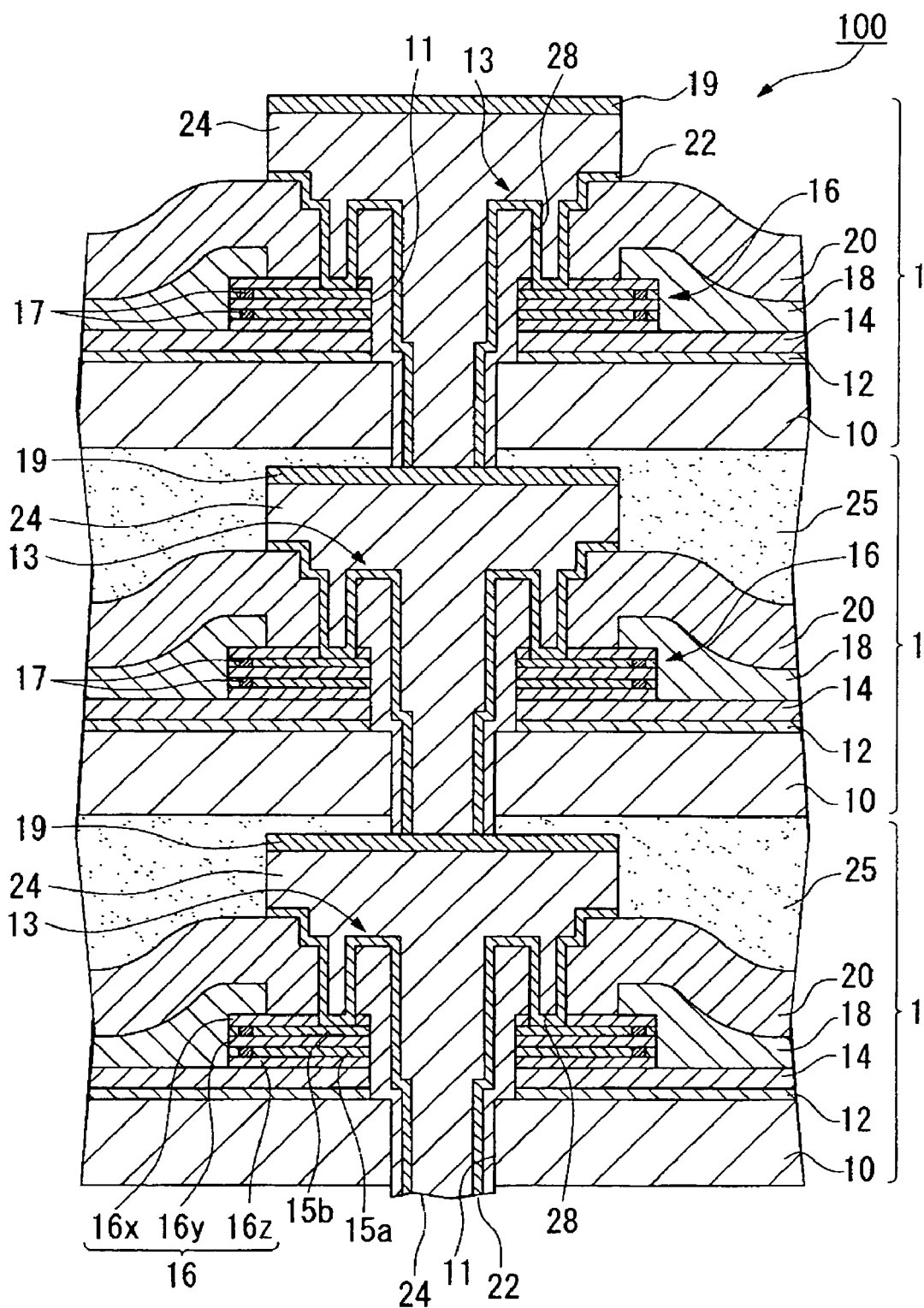
FIG. 1 is a cross-sectional schematic diagram showing a configuration of a semiconductor device according to a first embodiment.

An embodiment of the present invention may provide a semiconductor device having a configuration for suitably manufacturing a highly reliable three-dimensional stacking type semiconductor device in which an excellent electrical connection state is secured, and to provide a method of manufacturing the three-dimensional stacking type semiconductor device, a circuit board including a three-dimensional stacking type semiconductor device obtained by the manufacturing method, and an electronic instrument including the circuit board.

A semiconductor device according to one embodiment of the present invention includes a substrate and an electrode layer formed on the substrate, wherein the electrode layer includes a plurality of conductive layers and an insulating layer which are stacked, the insulating layer being interposed between two of the conductive layers adjacent each other, a through-hole being formed in each of the conductive layers lower than an uppermost conductive layer among the conductive layers, and the through-hole being filled with an insulating material.

In this embodiment the present invention, mechanical strength of the electrode layer is increased by forming the electrode layer by stacking the conductive layers, whereby a problem such as removal rarely occurs.

In the case of three-dimensionally mounting such semiconductor devices, it is necessary to vertically connect the connection terminals of the semiconductor devices by forming a connection terminal through-hole through the substrate and the electrode layer in the stacking direction, and inserting a conductive member (connection terminal) into the connection terminal through-hole.

Generally, in order to form the connection terminal through-hole in the electrode layer having a stacked structure and to insert the connection terminal into the connection terminal through-hole, it is necessary to alternately etch the conductive layers and the insulating layers. This step takes a large amount of time.

In this embodiment the present invention, the through-holes are formed in the conductive layers lower than the uppermost conductive layer of the electrode layer, and the through-holes are filled with the insulating material. Therefore, when forming the connection terminal through-hole in the electrode layer, the connection terminal through-hole can be easily formed by etching the inside of the through-holes filled with the insulating material without etching the stacked conductive layers. Specifically, when forming the connection terminal through-hole through the substrate and the electrode layer, it suffices to use the through-hole in each conductive layer formed in advance as a hole forming section and merely etch the layer consisting of the uppermost conductive layer, the insulating layer, and the insulating material (inside of the conductive layer through-holes) coaxially with the conductive layer through-holes. This eliminates the need to alternately etch the conductive layers and the insulating layers provided therebetween.

As described above, according to the semiconductor device of the embodiment of the present invention, steps can be simplified when three-dimensionally mounting the semiconductor devices, and the cost can be reduced.

It is desirable to form no electrical interconnect (dummy pattern for chemical mechanical polishing (CMP), for example) under the uppermost conductive layer, in particular, in the substrate hole forming section. In this case, a through-hole can be formed in the electrode layer without taking the electrical interconnect into consideration.

As a specific method of manufacturing a three-dimensional stacking type semiconductor device using the above-described semiconductor device, the following method may be employed, for example.

A method of manufacturing a three-dimensional stacking type semiconductor device according to another embodiment of present invention uses the above semiconductor device, the method including:

semiconductor device formation step which includes an electrode layer through-hole formation step of forming a hole in the uppermost conductive layer coaxially with the through-hole in each of the conductive layers lower than the uppermost conductive layer, and forming an electrode layer through-hole in the electrode layer by etching the insulating material, a step of forming a substrate through-hole connected with the electrode layer through-hole in the substrate, and a step of filling the electrode layer through-hole and the substrate through-hole with a conductive member; and semiconductor device stacking step of stacking a plurality of the semiconductor devices by using a conductive member of each of the semiconductor devices.

In the three-dimensional stacking type semiconductor device manufactured by using this manufacturing method, since the insertion hole (through-hole) for the conductive member which functions as a connection terminal is formed in the electrode layer, the space of the substrate can be saved in comparison with the case of forming a through-hole in the substrate in the region in which the electrode layer is not formed, whereby an increase in function and a reduction of size of the semiconductor device can be realized. Moreover, mechanical strength of the electrode layer is increased by forming the electrode layer by stacking the conductive layers, whereby a problem such as removal of the upper conductive layer rarely occurs. Therefore, according to this manufacturing method of the present invention, malfunction due to an electrical connection failure rarely occurs, whereby a highly reliable three-dimensional stacking type semiconductor device can be provided.

Since the through-holes filled with the insulating material are formed in advance in the stacked electrode layer, and the connection terminal through-hole is formed by etching the through-hole, it is unnecessary to alternately change the etching conditions for each of the conductive layers and the insulating layers when forming the connection terminal through-hole, whereby a semiconductor device can be manufactured remarkably efficiently.

In this embodiment the present invention, the conductive member has the function of a connection terminal in the axial direction of the through-hole, that is, the function of achieving electrical connection in the vertical direction of the substrate (stacking direction). It is desirable that a part of the conductive member project outward from the through-hole on the side of the substrate opposite to the side on which the electrode is formed. In this case, electrical connection with the outside can be easily achieved by using the projecting section.

A circuit board according to another embodiment of the present invention comprises the above semiconductor device. In this case, a highly reliable circuit board with a reduced size can be provided. An electronic instrument according to another embodiment of the present invention comprises this circuit board. In this case, a highly reliable electronic instrument having a reduced size can be provided.

In this embodiment the present invention, the shape of the connection terminal through-hole formed in the semiconductor device (axial cross-sectional shape or opening shape) may be circular or polygonal such as quadrangular. Three-dimensional stacking can also be realized by forming a plurality of through-holes for one electrode and inserting the conductive member into each of the through-holes. In this case, mechanical stability and electrical stability of vertical connection can be improved.

The electrode is generally formed of aluminum as an essential material. The electrode may be formed by using copper or the like. The shape of the electrode differs depending on the design. The electrode may be in the shape of a quadrilateral in which the length of one side is about 100 µm, for example. Aluminum or copper may be used as the material for the conductive member with which the through-hole is filled. A Cu damascene method may be employed when filling the through-hole with copper. Specifically, the conductive member may be formed by filling the through-hole with copper using a CVD method, an electroplating method, or the like, and polishing and removing an unnecessary area of the surface of the copper using CMP. In the case of using copper as the conductive member used as a connection terminal, a reduction of resistance suitable for a high-speed device is realized, whereby an extremely advantageous semiconductor device can be obtained.

The embodiments of the present invention are described below with reference to the drawings. In this embodiment the present invention, each layer and each material are scaled so that each layer and each material have a size recognizable in the drawings.

First Embodiment

FIG. 1 is a partial cross-sectional schematic diagram showing a major portion of a semiconductor device (three-dimensional stacking type semiconductor device) of a first embodiment. A semiconductor device 100 (three-dimensional stacking type semiconductor device) is formed by three-dimensionally mounting semiconductor device body sections 1, each having a configuration in which an electrode pad 16 is stacked on a silicon substrate 10 with an interposed insulating film 12 made of a thermal oxide film and an interlayer dielectric 14 made of $SiO_2$.

In the semiconductor device body section 1, the insulating film 12 with a thickness of about 4,000 Å, the interlayer dielectric 14 with a thickness of about 10,000 Å, and the electrode pad 16 with a thickness of about 8,000 Å are stacked on the silicon substrate 10. The semiconductor device body section 1 includes a through-hole 11 which is formed through the silicon substrate 10, the insulating film 12, the interlayer dielectric 14, and the electrode pad 16 in the stacking direction. A connection terminal 24 made of a conductive member is inserted into the through-hole 11. A passivation film 18 having an opening with a diameter greater than the diameter of the through-hole 11 in the electrode pad 16 is formed on the electrode pad 16. An insulating layer 20 is stacked on the electrode pad 16 and the passivation film 18. The insulating layer 20 includes a connection hole 28 on the electrode pad 16 in a region in which the passivation film 18 is not formed, and an insulating wall section 13 which faces the through-hole 11. The insulating layer 20 is formed to extend from the electrode pad 16 to the surface in the through-hole 11. The insulating layer 20 is located between the electrode pad 16 and the connection terminal 24 to insulate the electrode pad 16 from the connection terminal 24.

In more detail, the insulating layer 20 is formed to cover the upper surface of the electrode pad 16 and the surface in the through-hole 11. The insulating layer 20 includes the connection hole 28 for connecting at least the electrode pad 16 with the connection terminal 24 at a position differing from the through-hole 11 on the surface of the substrate 10. The insulating wall section 13 is disposed between the connection hole 28 and the through-hole 11. The insulating wall section 13 includes at least a circular projecting section which projects from the surface of the electrode pad 16 along the surface in the through-hole 11. The insulating wall section 13 includes a hole along the through-hole 11.

The connection terminal 24 is inserted into the hole in the insulating layer 20 including the insulating wall section 13 with a base film 22 interposed. The connection terminal 24 formed inside the through-hole 11 is connected with the electrode pad 16 in the connection hole 28 over the insulating wall section 13 of the insulating layer 20 from the through-hole 11. In the present embodiment, a level difference is formed on the surface in the through-hole 11 near the boundary between the substrate 10 and the insulating film 12. A level difference is also formed on the contact surface of the connection terminal 24 with the hole. The opening shape of the through-hole 11 (hole axis cross-sectional shape) is circular. However, the opening shape of the through-hole 11 may be polygonal such as quadrangular.

The electrode pad 16 has a configuration in which conductive layers 16x, 16y, and 16z made of Al, Cu, or polysilicon are stacked with insulating layers 15a and 15b interposed therebetween. The conductive layers 16x, 16y, and 16z have a thickness of about 3,000 to 8,000 Å. The conductive layers 16x, 16y, and 16z are electrically connected through a contact hole 17 formed therethrough in the vertical direction.

The insulating layer 20 including the insulating wall section 13 is formed on the surface in the hole in the electrode pad 16 as described above. The connection terminal 24 is planarly connected with the electrode pad 16 through the connection hole 28 over the insulating wall section 13 from the through-hole 11. Specifically, the connection terminal 24 provided in the through-hole 11 covers the insulating wall section 13 of the insulating layer 20 selectively formed on the electrode pad 16 at a position facing the through-hole 11, and is also provided in the connection hole 28 formed in the insulating film 20 at a position differing from the surface of the through-hole 11 so as to be connected with the electrode pad 16.

A plurality of the connection holes 28 used to connect the electrode pad 16 with the connection terminal 24 may be formed for one electrode pad 16. In this case, mechanical bonding strength between the electrode pad 16 and the connection terminal 24 is increased, whereby connection stability is improved.

A plating thin film 19 made of tin-silver is formed on the upper surface of the connection terminal 24. The semiconductor device body sections are stacked and connected through the plating thin film 19. In the semiconductor device body section 1, the connection terminal 24 is formed to project from the through-hole 11 in the silicon substrate 10 to some extent. The projecting section is connected with the connection terminal of another semiconductor device body section through the plating thin film. The space between the stacked semiconductor device body sections is filled with an underfill 25.

According to the semiconductor device 100 of the present embodiment, since the through-hole 11 is formed in the electrode pad 16, space can be saved in comparison with the case of forming a through-hole on the silicon substrate 10 in the region in which the electrode pad 16 is not formed, whereby an increase in function and a reduction of size of the semiconductor device can be realized.

An example of a method of manufacturing the semiconductor device 100 shown in FIG. 1 is described below. FIGS. 2A to 6B are cross-sectional views showing steps relating to the present invention among a process of manufacturing the semiconductor device 100. The present embodiment illustrates the case of performing various types of processing for a semiconductor substrate, such as a silicon wafer, as an example. However, the processing described below may be performed for an individual semiconductor chip instead of performing the processing for the semiconductor substrate in which a number of semiconductor chips are formed. The semiconductor chip is generally in the shape of a rectangular parallelepiped (including a cube). However, the shape of the semiconductor chip is not limited. The semiconductor chip may be cylindrical (including spherical).

The configuration of the semiconductor substrate as the processing target is described below. In FIG. 2A, the insulating film 12 is formed on the surface of the substrate 10 (silicon substrate) in which an integrated circuit including a transistor, a memory device, and other electronic devices (not shown) is formed. The insulating film 12 is formed of an oxide film ($SiO_2$) of silicon (Si) which is an essential material for the substrate 10, for example.

The interlayer dielectric 14 is formed of borophosphosilicate glass (hereinafter called "BPSG") on the insulating film 12, for example. In a semiconductor device having a multilayer interconnect structure, in the case where the semiconductor device has a three-layer interconnect structure, an interlayer dielectric 14a and an interlayer dielectric 14b are further stacked on the interlayer dielectric 14. Specifically, in the case where the semiconductor device has an n-layer multilayer interconnect structure, n layers of interlayer dielectrics are stacked (not shown). A silicon oxide film or a low-dielectric-constant film with a thickness of 5,000 to 10,000 Å is used as the interlayer dielectric. The electrode pad 16 as an electrode electrically connected with the integrated circuit (not shown) formed in the substrate 10 is formed on the interlayer dielectric 14. The electrode pad 16 has a configuration in which the conductive layers 16x, 16y, and 16z made of Al, Cu, or polysilicon are stacked with the insulating layers 15a and 15b interposed therebetween. The conductive layers 16x, 16y, and 16z have a thickness of about 3,000 to 8,000 Å. A through-hole 61 is formed in the conductive layers 16y and 16z but not in the uppermost conductive layer 16x. The through-hole 61 is filled with the same insulating material as the material for the insulating layers 15a and 15b. In the present embodiment, it is desirable to form no electrical interconnect (dummy pattern for chemical mechanical polishing (CMP), for example) under the uppermost conductive layer 16x, in particular, in a substrate hole forming section. In this case, a hole can be formed in the electrode pad 16 without taking the electrical interconnect into consideration.

The lower conductive layer 16z is formed by forming a conductive layer over the entire surface of the interlayer dielectric 14 by using a CVD method or sputtering, and patterning the conductive layer into a given shape including the through-hole 61 (circular shape, for example) using a resist or the like. The insulating film 15a is formed on the conductive layer 16z. The conductive layer 16y is formed in the same manner as the conductive layer 16z, and the insulating film 15b is formed on the conductive layer 16y. The uppermost conductive layer 16x is formed over the entire surface by sputtering, and patterned into a given shape (circular shape, for example) to form the electrode pad 16. The electrode pad 16 may be formed by using Al as an essential material. However, it is desirable to form the electrode pad 16 using copper with low electrical resistance. The configuration of the electrode pad 16 is not limited to the above-described configuration. The configuration of the electrode pad 16 may be appropriately changed depending on necessary electrical characteristics, physical characteristics, and chemical characteristics.

The electrode pads 16 are formed along at least one side (two or four sides in many cases) of the surface of each of a plurality of semiconductor chips formed in the substrate 10. The electrode pads 16 may be formed along the side of the surface of the semiconductor chip, or may be formed at the center of the semiconductor chip. An electronic circuit is not formed under the electrode pad 16.

The passivation film 18 as a protective layer is formed on the interlayer dielectric 14 so as to cover the electrode pad 16. The passivation film 18 may be formed of silicon oxide ($SiO_2$), silicon nitride (SiN), a polyimide resin, or the like.

The steps performed for the semiconductor substrate having the above-described configuration are described below. A resist (not shown) is applied to the entire surface of the passivation film 18 shown in FIG. 2A using a spin coating method, a dipping method, a spray coating method, or the like. The resist is used to form an opening in the passivation film 18 which covers the electrode pad 16. The resist may be any of a photoresist, an electron beam resist, and an X-ray resist. The resist may be either a positive-tone resist or a negative-tone resist.

After applying the resist to the passivation film 18, prebaking is performed. The resist is then patterned into a given shape by performing exposure and development using a mask in which a given pattern is formed. The shape of the resist is set corresponding to the shape of the opening in the electrode pad 16 (shape of the through-hole 61). After patterning the resist, post baking is performed. As shown in FIG. 2B, a part of the passivation film 18 which covers the electrode pad 16 is etched to form an opening H1. FIG. 2B is a cross-sectional view showing the state in which the opening H1 is formed by forming an opening in the passivation film 18. FIG. 2B shows the configuration according to the semiconductor device of the present invention together with FIG. 2A.

The passivation film 18 may be etched by dry etching. The dry etching may be reactive ion etching (RIE). Wet etching may also be applied. The cross-sectional shape of the opening H1 formed in the passivation film 18 is set corresponding to the opening shape of the through-hole 61 formed in the conductive layers 16y and 16z of the electrode pad 16. The diameter of the opening H1 is set to be greater than the diameter of the through-holes 61.

After the above-described steps are completed, an opening is formed in the electrode pad 16, the interlayer dielectric 14, and the insulating film 12 by dry etching using a resist 71 formed on the passivation film 18, in which the opening H1 is formed, as a mask. FIG. 2C is a cross-sectional view showing the state in which an opening H2 is formed by forming an opening in the electrode pad 16, the interlayer dielectric 14, and the insulating film 12. RIE may be used as dry etching.

In this example, an opening is formed in the electrode pad 16, the interlayer dielectric 14, and the insulating film 12 in the single step using the resist 71 having an opening diameter approximately the same as the opening diameter of the through-hole in the electrode pad 16 (16y and 16z). However, after forming an opening in the electrode pad 16, an opening may be formed in the interlayer dielectric 14 and the insulating film 12 in another step. In the above-described process, etching is repeatedly performed by using a single resist mask. However, the resist may be patterned after the etching step of the electrode pad 16 is completed.

The surface of the substrate 10 is exposed as shown in FIG. 2C by the above-described steps. The resist formed on the passivation film 18 used as the mask for forming an opening is removed by using a removal solution or by ashing or the like.

Figure 8:
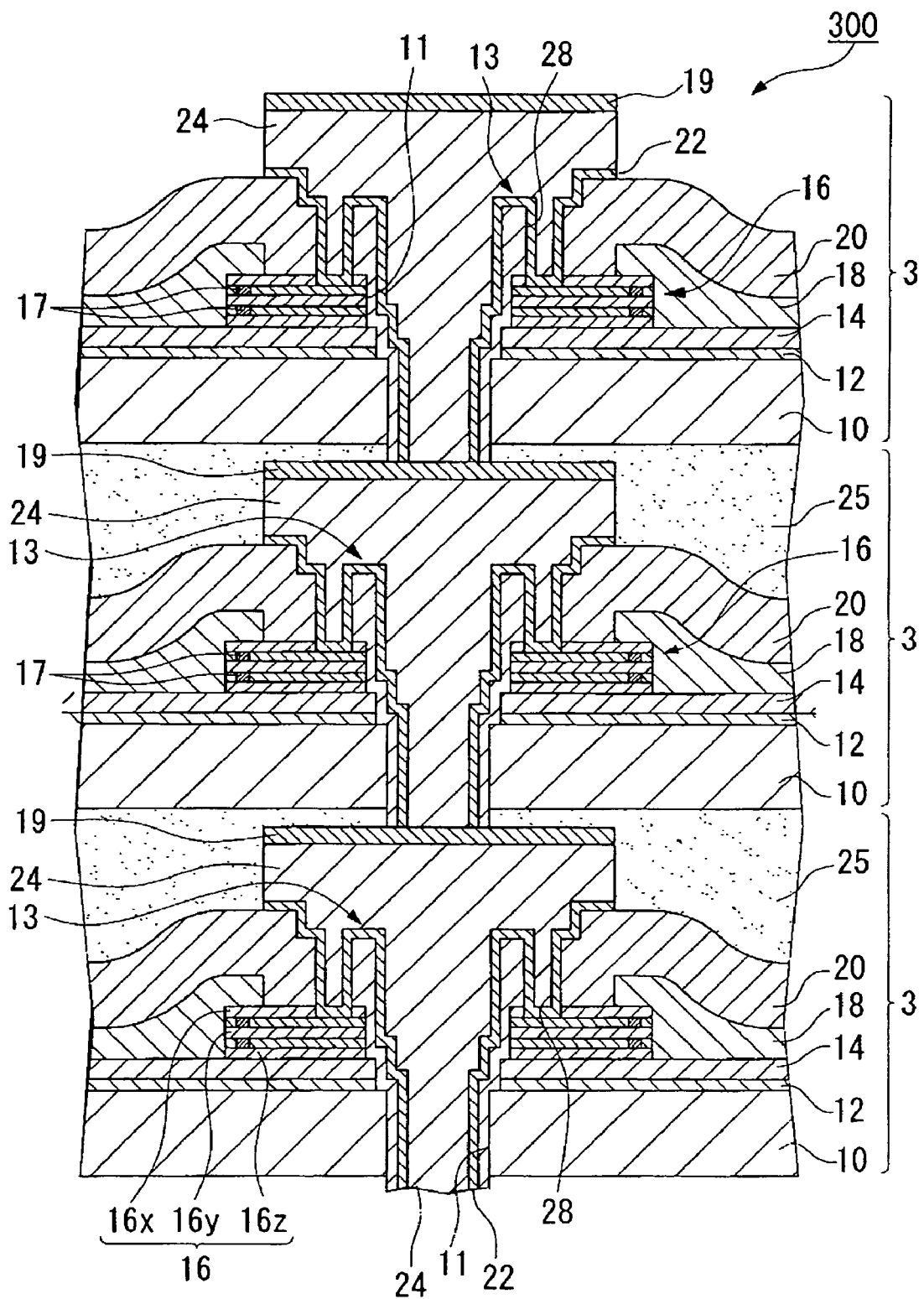
FIG. 8 is a cross-sectional schematic diagram showing a configuration of a modification of a semiconductor device.

A semiconductor device 300 including semiconductor device body sections 3 as shown in FIG. 8 can be provided by forming an opening in the interlayer dielectric 14 and the insulating film 12 in another step after forming an opening in the electrode pad 16, for example. Specifically, the diameter of the through-hole formed in the electrode pad 16 differs from the diameter of the through-hole formed in the interlayer dielectric 14 and the insulating film 12. As a result, a level difference is formed on the surface in the through-hole 11 near the boundary between the electrode pad 16 and the interlayer dielectric 14. In this case, a problem such as removal of the connection terminal 24 from the through-hole 11 rarely occurs, whereby stability of the connection state can be improved.

Figure 3A:
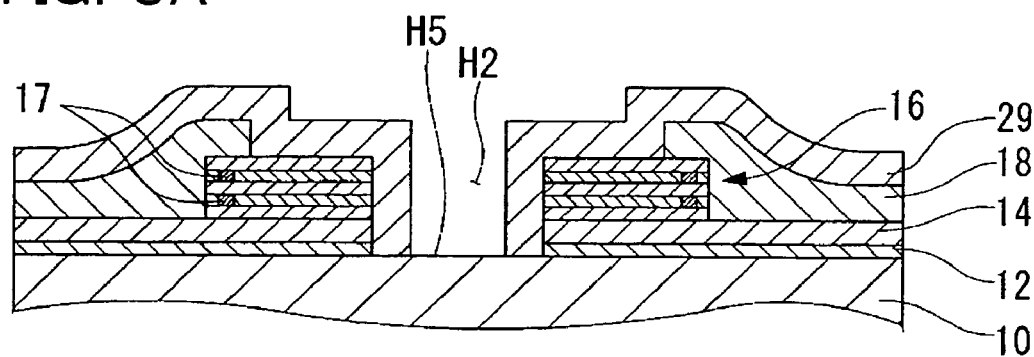
FIGS. 3A and 3B are cross-sectional schematic diagrams showing the steps after the step shown in FIG. 2C in the manufacturing process of the semiconductor device.

As shown in FIG. 3A, an etching hard mask 29 for forming a hole in the substrate 10 is formed. The hard mask 29 is formed to cover the upper surfaces of the passivation film 18 and the electrode pad 16 and the surface in the opening H2. The hard mask 29 may be formed of an insulating material such as $SiO_2$ by using a CVD method or the like. After forming the hard mask 29 on the entire surface, an opening H5 is formed in the hard mask 29 at the bottom of the opening H2, as shown in FIG. 3A, to expose the surface of the substrate 10 in the opening H2. In this example, a hole is formed in the hard mask 29 by etching using a resist having an opening corresponding to the opening H5. The hard mask 29 may be etched by dry etching. The dry etching may be reactive ion etching (RIE).

Figure 3B:
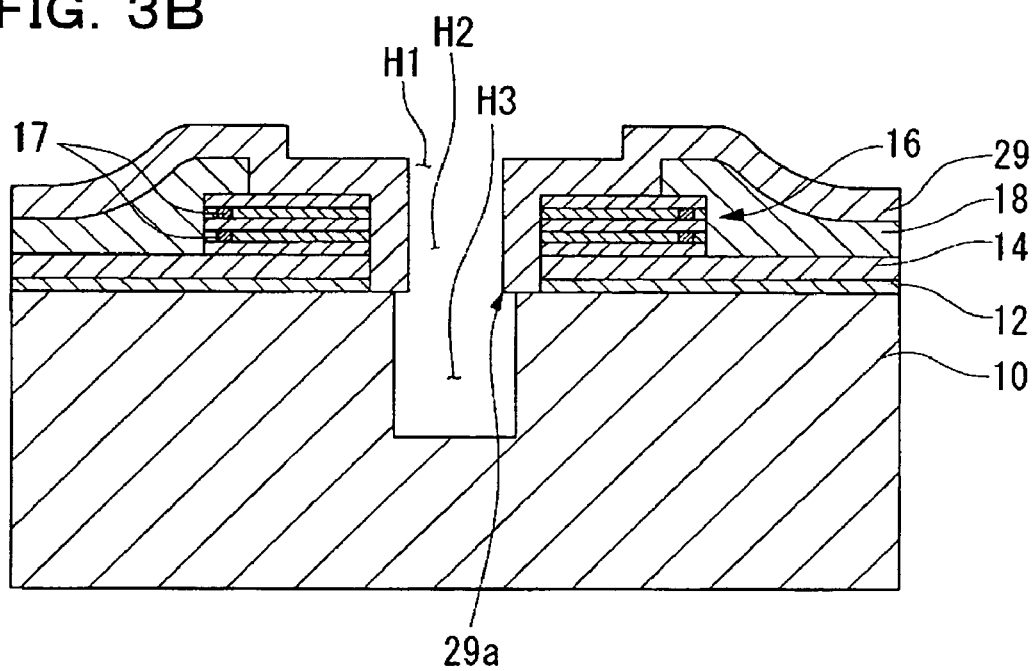

A hole is formed in the substrate 10 by dry etching using, as a resist mask, the hard mask 29 having the opening H5, as shown in FIG. 3B. As dry etching, inductively coupled plasma (ICP) may be used instead of RIE. FIG. 3B is a cross-sectional view showing the state in which a hole H3 is formed by forming a hole in the substrate 10. The diameter of the opening H5 in the hard mask 29 is set at 30 to 50 μm (30 μm, for example) taking over-etching (side-etching) when forming a hole in the substrate into consideration.

In this example, since a hole is formed in the substrate 10 using the hard mask 29 formed on the passivation film 18 and the electrode pad 16 and on the surfaces in the openings H1 and H2, the diameter of the hole H3 formed in the substrate 10 is smaller than the diameter of the opening H2 formed in the electrode pad 16, as shown in FIG. 3B. As a result, a level difference formed by the projecting section of the substrate 10 is formed in the through-hole formed by connecting the openings H1 and H2 and the hole H3.

In the case of forming a hole with a depth of about 70 μm in the substrate 10, it is necessary to form a silicon oxide film using tetraethyl orthosilicate ($Si(OC_2H_6)_4$: hereinafter called "TEOS") as a raw material utilizing plasma enhanced chemical vapor deposition (PECVD) (PE-TEOS method) to a thickness of about 2 μm as the hard mask 29. As the formation method of the hard mask 29, an $O_3$-TEOS method in which a silicon oxide film is formed by using ozone and TEOS utilizing a thermal CVD method, or an $SiH_4$—$N_2O$ or $SiH_4$—$O_2$ plasma enhanced CVD method may be used instead of the PE-TEOS method. The thickness of the hard mask 29 is reduced by the substrate hole formation step. The thickness of the hard mask 29 is reduced to about 1,000 to 9,000 Å after the substrate hole formation step. Specifically, in the present embodiment, the thickness of the hard mask 29 is set to be greater than the amount of over-etching.

Since a conventional photo resist mask has poor dry etching resistance, a resist mask with a thickness of about 10 μm is necessary to form a hole with a depth of 70 μm. This increases cost due to an increase in the thickness of the resist mask, and results in an inefficient process due to an increase in the aspect ratio. However, the film thickness can be reduced by using the hard mask 29, whereby a reduction of cost and an efficient manufacturing process can be realized.

Figure 4A:
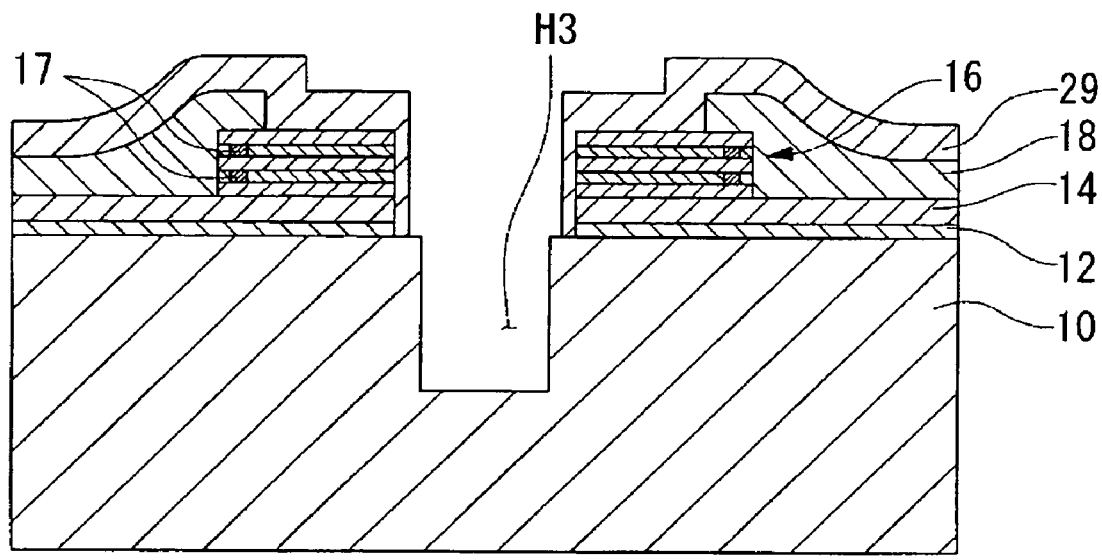
FIGS. 4A and 4B are cross-sectional schematic diagrams showing the steps after the step shown in FIG. 3B in the manufacturing process of the semiconductor device.

After the above-described steps are completed, a projecting section 29a of the hard mask 29 remaining so as to project inward from the surface in the hole H3 is removed by etching. Specifically, the projecting section 29a of the hard mask 29 remaining on the inner wall of the opening in the electrode pad 16, the interlayer dielectric 14, and the insulating film 12 which projects inside the hole H3 is selectively removed by etching so that the hard mask 29 with a small thickness remains on the inner wall of the opening in the electrode pad 16, the interlayer dielectric 14, and the insulating film 12, as shown in FIG. 4A. FIG. 4A is a cross-sectional view showing a state in which the hard mask 29 is allowed to remain on the electrode pad 16 and the inner wall of the opening H2. The hard mask 29 can be formed (allowed to remain) on the inner wall of the opening in the electrode pad 16, the interlayer dielectric 14, and the insulating film 12 so as to have an opening diameter greater than the diameter of the hole H3 by etching the hard mask 29 as described above. In this case, the diameter of the opening in the hard mask 29 formed in the electrode pad 16 corresponds to the diameter of the hole formed in the substrate and the diameter of the opening formed in the electrode. For example, when the diameter of the hole in the substrate is 30 μm and the diameter of the opening in the electrode is 60 μm, the diameter of the opening in the hard mask 29 formed in the electrode pad 16 is about 40 to 58 μm (50 μm, for example).

Figure 4B:
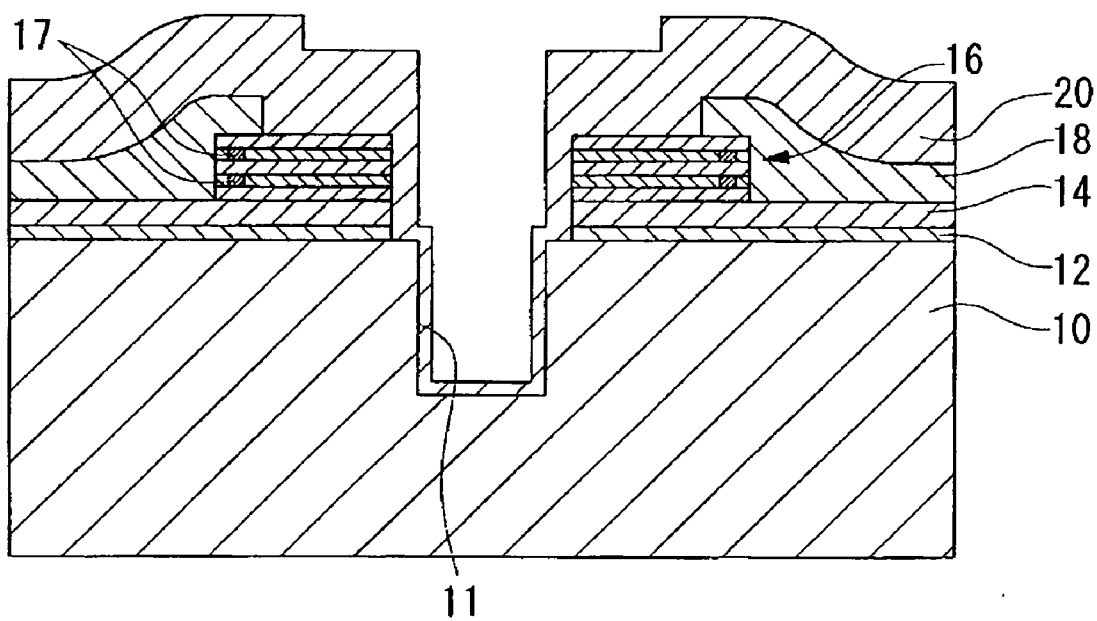

After removing the resist for removing the projecting section 29a, an insulating film is formed on the hard mask 29 and inside of the hole H3. In this example, a silicon oxide film is formed to a thickness of about 1 to 3 μm using the PE-TEOS method. As a result, the insulating film 20 is formed inside the through-hole 11 formed in the substrate 10, the insulating films 12 and 14, and the electrode pad 16, as shown in FIG. 4B. The insulating film 20 may be a silicon nitride film formed to a thickness of about 1 to 3 μm using a plasma CVD method. The insulating film 20 may be formed by forming (stacking) the silicon oxide film and the silicon nitride film to a thickness of about 1–3 μm in total. In the case of forming the insulating film 20 by stacking the silicon oxide film and the silicon nitride film, the silicon oxide film may be formed at a position closer to the substrate 10 than the silicon nitride film by forming the silicon nitride film after forming the silicon oxide film.

A resist (not shown) is applied to the insulating film 20. The resist is used to form an opening on a part of the electrode pad 16. After applying the resist, prebaking is performed. The resist is then patterned into a shape in which the resist remains in the area excluding over the electrode pad 16 and the hole H3 and its peripheral section, such as a circular shape around the hole H3 (including peripheral section), by performing exposure and development using a mask in which a given pattern is formed.

Figure 5A:
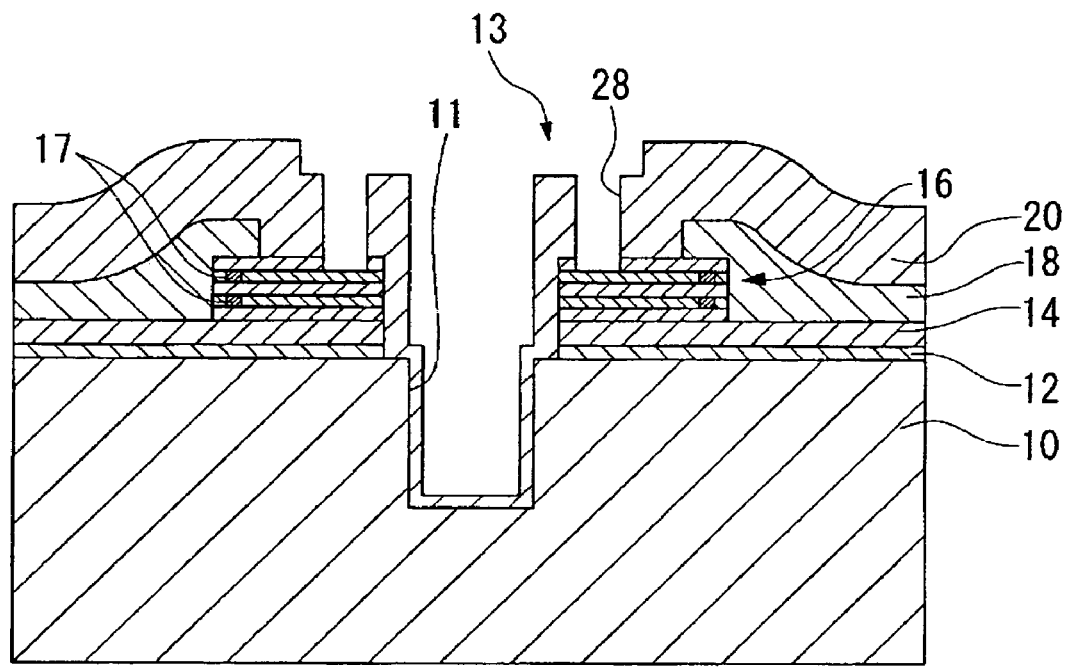
FIGS. 5A and 5B are cross-sectional schematic diagrams showing the steps after the step shown in FIG. 4B in the manufacturing process of the semiconductor device.

After patterning of the resist is completed, post baking is performed. As shown in FIG. 5A, a connection hole is formed in a part of the electrode pad 16 in a state in which the insulating wall section 13 remains around the opening in the electrode pad 16 by removing a part of the insulating film 20 which covers the electrode pad 16 by etching. FIG. 5A is a cross-sectional view showing the state in which a part of the insulating film 20 which covers the electrode pad 16 is removed. As shown in FIG. 5A, the connection hole 28 is formed in the region excluding the peripheral section of the opening in the electrode pad 16, whereby a part of the electrode pad 16 is exposed. A connection terminal (electrode section) formed in a step described later can be connected with the electrode pad 16 through the connection hole 28.

Figure 5B:
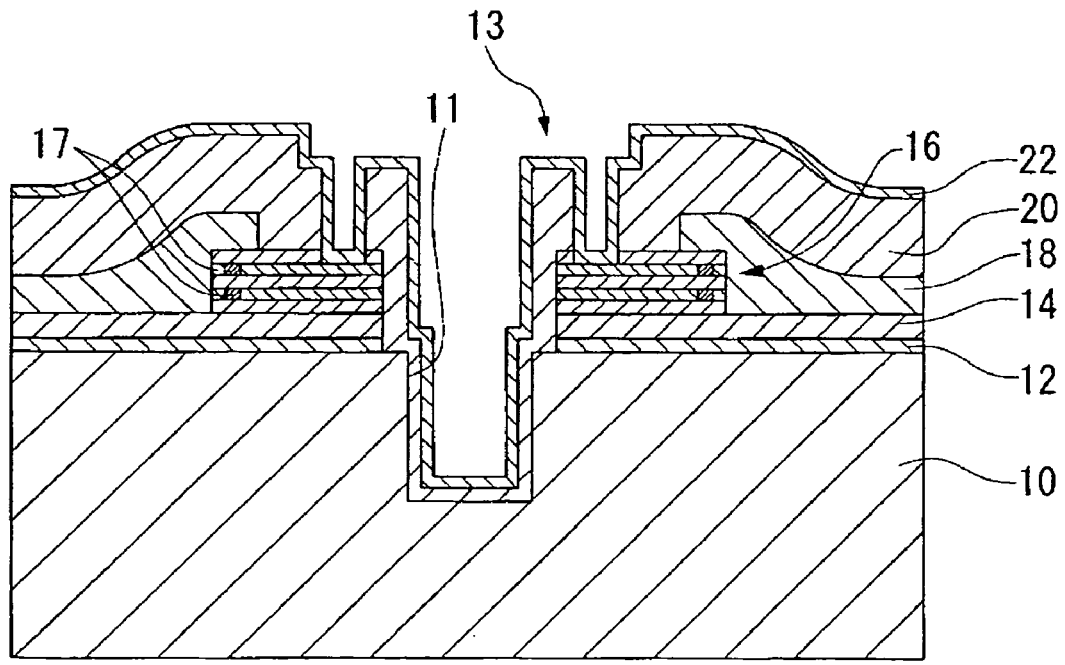

After the above-described steps are completed, the base film 22 including a barrier layer and a seed layer is formed on the surface of the insulating film 20, the exposed section of the electrode pad 16, and the inner surface and the bottom of the through-hole 11. FIG. 5B is a cross-sectional view showing the state in which the base film 22 is formed. As shown in FIG. 5B, the base film 22 is continuously formed on the electrode pad 16 and the insulating film 20 so as to sufficiently cover the insulating wall section 13 and inside of the connection hole 28.

Figure 6A:
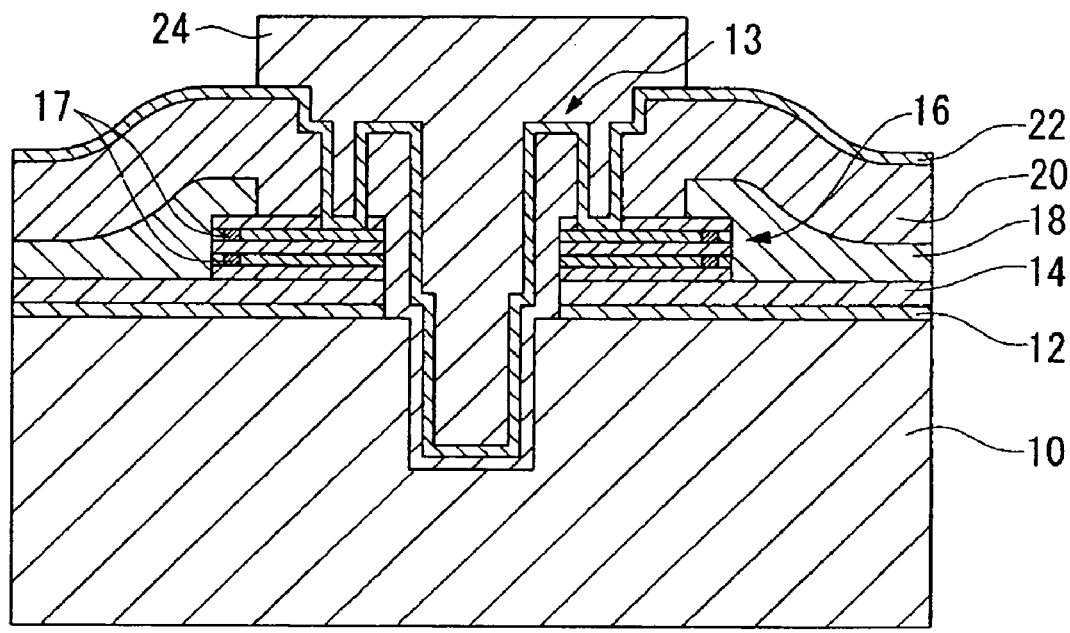
FIGS. 6A and 6B are cross-sectional schematic diagrams showing the steps after the step shown in FIG. 5B in the manufacturing process of the semiconductor device.

After the base film 22 is formed, a resist for forming a connection terminal is applied. The base film 22 is plated by using an electrochemical plating (ECP) method including the area inside the through-hole 11 and the connection hole 28 to fill the through-hole 11 with copper, and the connection hole 28 is also filled with copper over the insulating wall section 13, whereby the connection terminal 24 is formed, as shown in FIG. 6A. As a result, the connection terminal 24 is electrically connected with the electrode pad 16 in the connection hole 28 in the region differing from the through-hole 11, whereby the connection terminal 24 is formed as an external electrode on the upper surface of the substrate 10.

Figure 6B:
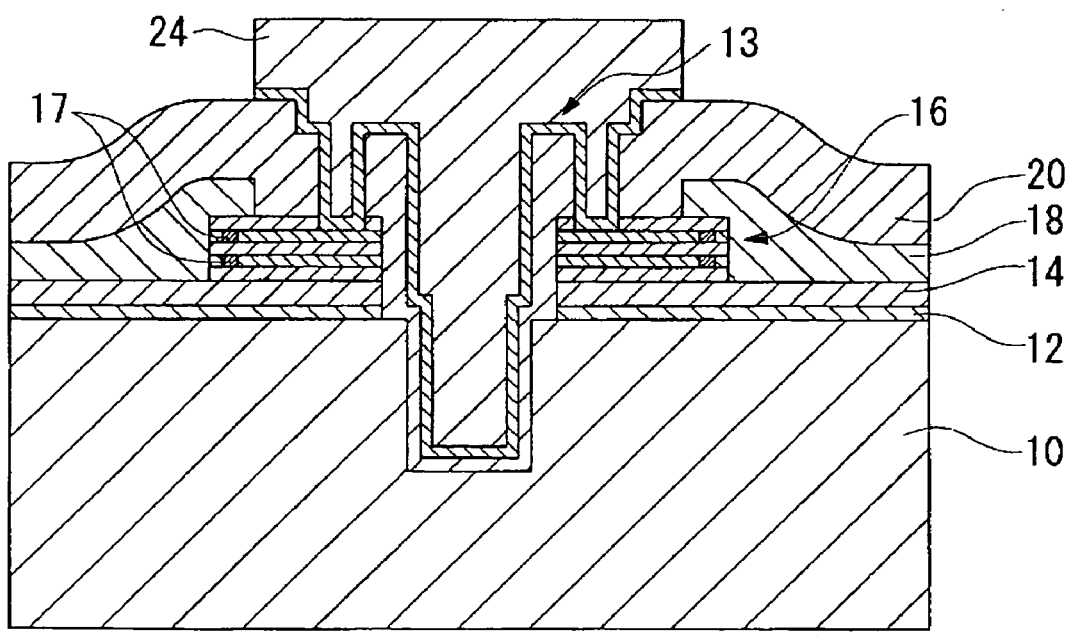

The resist is then removed and an unnecessary portion of the barrier layer and the seed layer (not shown) is removed by etching, whereby a state as shown in FIG. 6B is formed.

The semiconductor device body section manufactured by the above-described steps is ground on the back surface of the substrate 10 until the connection terminal 24 is exposed from the back surface of the substrate 10 by way of example, whereby an electrode electrically connected with the exposed connection terminal 24 is formed. The connection terminal 24 may be exposed from the back surface of the substrate 10 by grinding the back surface of the substrate 10 near the connection terminal 24, and etching the back surface of the substrate 10 so that the connection terminal 24 is exposed. A three-dimensional stacking type (stacked type) semiconductor device which enables high-density mounting can be manufactured by stacking the semiconductor device body sections in which the electrodes are formed on the upper surface and the back surface of the substrate 10, or by stacking at least one semiconductor device body section in which the electrodes are formed on the upper surface and the back surface of the substrate 10 and another semiconductor device body section, and interconnecting the semiconductor device body sections.

The semiconductor device body sections may be stacked by bonding the electrodes of the adjacent upper and lower semiconductor device body sections while securing electrical connection between the electrodes using a filler metal such as solder. An adhesive may be used merely for bonding the semiconductor device body sections. The adhesive may be a liquid or gelled adhesive or an adhesive sheet. The adhesive may contain an epoxy resin as an essential material, or be an insulating adhesive.

In the case where the semiconductor device body sections are bonded and electrically connected by using an adhesive, an adhesive containing a conductive substance may be used. The conductive substance includes particles of a filler metal or solder, and is dispersed in an adhesive material. The particles function as braze when bonding the connection targets, whereby bonding cability can be further improved.

The adhesive may be an anisotropic conductive adhesive (ACA) in which conductive particles are dispersed, such as an anisotropic conductive film (ACF) or anisotropic conductive paste (ACP). The anisotropic conductive adhesive is a product in which conductive particles (fillers) are dispersed in a binder. A dispersing agent may be added to the anisotropic conductive adhesive. A heat-curable adhesive is generally used as the binder for the anisotropic conductive adhesive. In this case, conductive particles are present between the interconnect pattern and the electrode to achieve electrical connection between the interconnect pattern and the electrode.

The electrodes may be electrically connected by using a metal junction such as Au—Au, Au—Sn, or solder. For example, these materials are provided to the electrode, and the electrodes are bonded by applying heat, ultrasonic vibration, or ultrasonic vibration and heat. After the electrodes are bonded, the material provided to the electrode is diffused due to vibration or heat, whereby a metal junction is formed.

An external terminal is connected with the connection terminal 24 of the semiconductor device body section located at the bottom (or top) of the three-dimensional stacking type semiconductor device formed by stacking the semiconductor device body sections. The external terminal may be formed of solder or a metal. However, the material for the external terminal is not limited thereto. It suffices that the external terminal be formed of a conductive material. A solder ball is not necessarily provided. A semiconductor module may be formed by mounting the semiconductor device body section on a substrate. An electrical connection may be achieved by utilizing surface tension during melting of solder cream applied to a motherboard when mounting the semiconductor device body section on the motherboard without forming a solder ball.

As described above, according to the method of manufacturing a semiconductor device of the present embodiment, when forming the through-hole 11, into which the connection terminal 24 is inserted, in the electrode pad 16, the through-holes 61 filled with the insulating material are formed in advance in the stacked conductive layers 16y and 16z, and the opening H2 to be filled with the connection terminal is formed by etching the through-hole 61. Therefore, it is unnecessary to alternately change the etching conditions for each of the conductive layers 16y and 16z and the insulating layers 15a and 15b when forming the opening for the connection terminal, whereby a semiconductor device can be manufactured remarkably efficiently. Moreover, according to the present embodiment, since the connection terminal 24 is formed by forming the opening H2 in the electrode pad 16, the area of the semiconductor device can be effectively utilized in comparison with the case of forming the connection terminal 24 at a position differing from the formation position of the electrode pad 16, whereby the degrees of freedom of design of the semiconductor device are improved. Specifically, in the case where the connection terminal 24 is formed at a position differing from the formation position of the electrode pad 16, the size of the connection terminal 24 may be limited. However, since the size of the connection terminal 24 can be made approximately equal to the size of the electrode pad 16 in the present embodiment, the area connected with another semiconductor device is increased, whereby reliability of the semiconductor device can be improved.

In the present embodiment, copper is used as the conductive member which forms the connection terminal 24. A Cu damascene method may be employed when filling the opening with copper. Specifically, the connection terminal 24 may be formed by filling the hole H3 with copper by using a CVD method, an electroplating method, or the like, and polishing and removing an unnecessary substance on the surface by using CMP. The connection terminal 24 may be formed by using aluminum or the like other than copper as an essential material.

Second Embodiment

Figure 7:
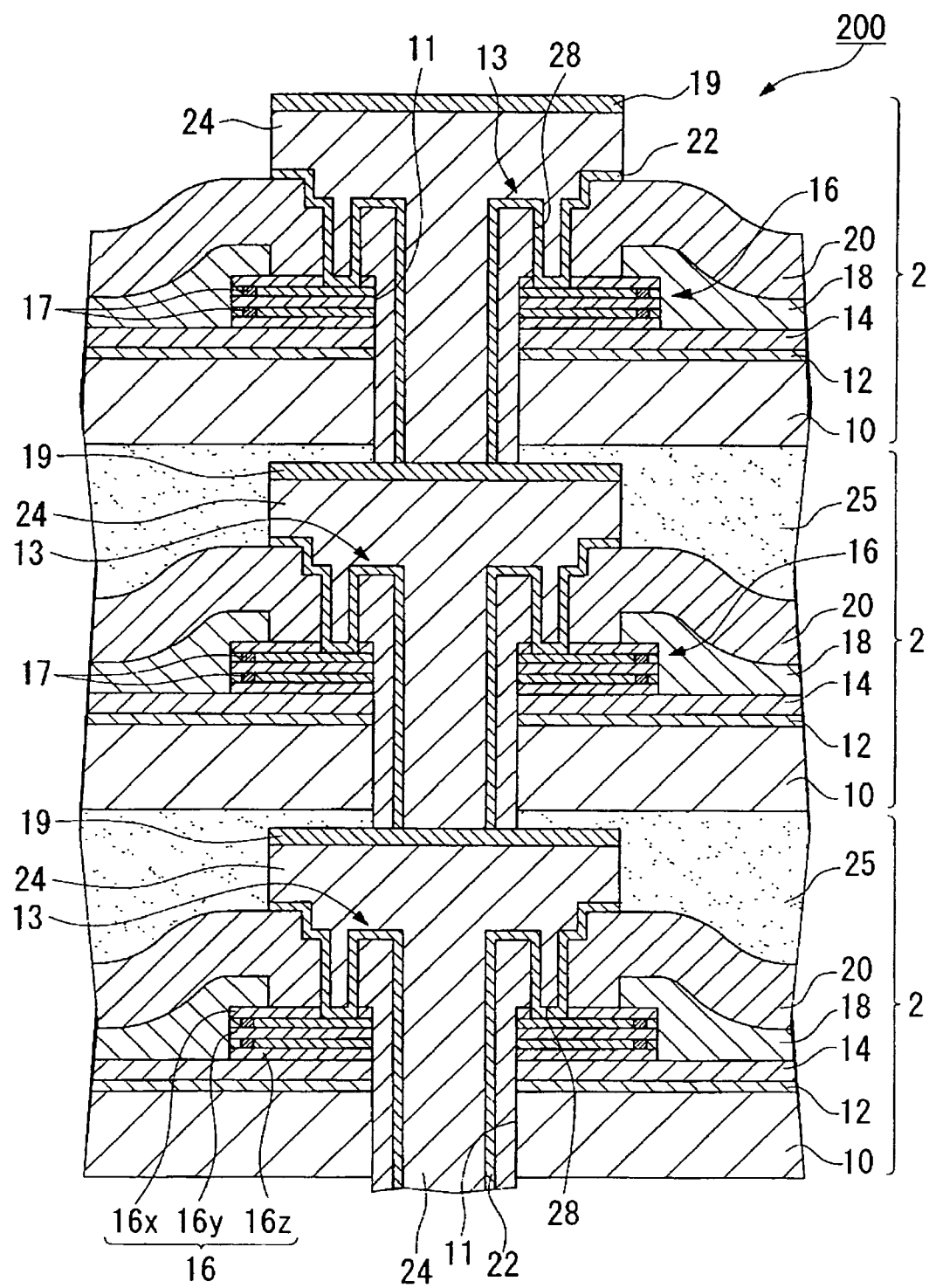
FIG. 7 is a cross-sectional schematic diagram showing a configuration of a semiconductor device according to a second embodiment of the present invention.

A second embodiment of a semiconductor device of the present invention is described below. FIG. 7 is a partial cross-sectional schematic diagram showing a major portion of a semiconductor device of the second embodiment. FIG. 7 corresponds to FIG. 1 in the first embodiment. A semiconductor device 200 of the second embodiment is formed by stacking a plurality of semiconductor device body sections 1, each having a configuration in which the electrode pad 16 is stacked on the silicon substrate 10 with the interposed insulating film 12 and the interlayer dielectric 14. The second embodiment differs from the first embodiment in that the through-hole 11 is formed straightly through the silicon substrate 10, the insulating film 12, the interlayer dielectric 14, and the electrode pad 16. Therefore, the sections the same as the sections shown in FIG. 1 are indicated by the same symbols. Description of these sections is omitted.

A semiconductor device body section 2 includes the through-hole 11 formed straightly through the silicon substrate 10 and the electrode pad 16 (in which the conductive layers 16x, 16y, and 16z are stacked) in the stacking direction of the silicon substrate 10 and the electrode pad 16. The connection terminal 24 made of a conductive member is inserted into the through-hole 11. According to the semiconductor device 200 of the present embodiment, since the surface in the through-hole 11 is formed straightly in a state in which a level difference is not formed, plating or the like for the surface in the through-hole 11 is facilitated, whereby a uniform thin film can be formed in comparison with the case where a level difference is formed.

In the present embodiment, since the through-hole 11 is formed in the electrode pad 16, space can be saved in comparison with the case of forming a through-hole on the silicon substrate 10 in the region in which the electrode pad 16 is not formed, whereby an increase in function and a reduction of size of the semiconductor device can be realized.

In the method of manufacturing the semiconductor device 200 shown in FIG. 7, the step of forming an opening in the electrode pad 16 and the insulating films 12 and 14 and the step of forming a hole in the substrate 10 as shown in FIGS. 2B and 2C may be performed in a single step. This enables the diameter of the opening in each layer to be approximately the same, whereby the through-hole 11 with no or only a small level difference can be formed. In the case where a level difference is formed even in the case of using such a method, the level difference may be removed by etching.

After performing the step of forming a hole in the substrate 10, the insulating film 20 as shown in FIG. 4B and the connection hole 28 and the base film 22 as shown in FIG. 5 are formed, and the openings are filled with the connection terminal 24 to obtain the semiconductor device body section 2 in which a difference in level is not formed in the through-hole 11.

Third Embodiment

Figure 9:
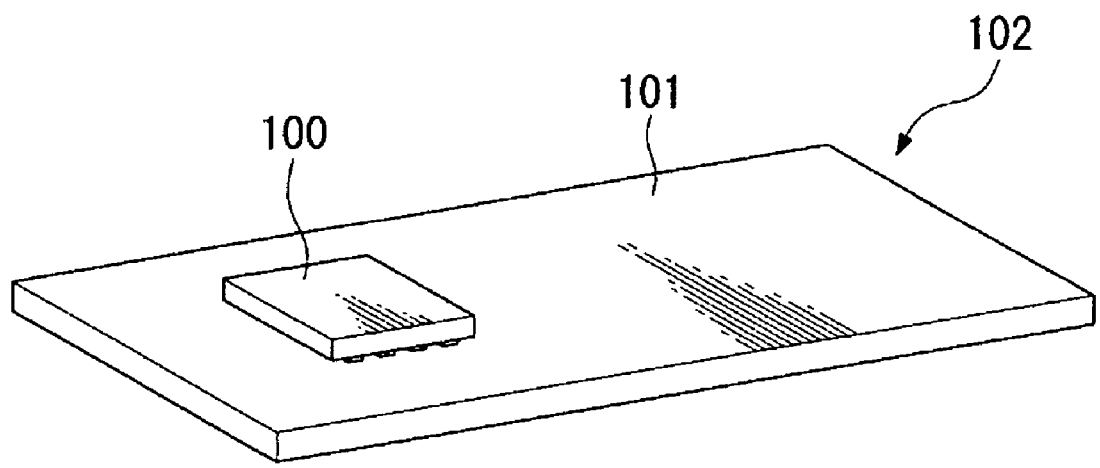
FIG. 9 is a perspective view showing a schematic configuration of a circuit board according to a third embodiment of the present invention.

FIG. 9 is an oblique view showing a schematic configuration of an embodiment of a circuit board of the present invention. As shown in FIG. 9, a circuit board 102 in the present embodiment has a configuration in which the semiconductor device 100 (200, 300) is mounted on a substrate 101. An organic substrate such as a glass epoxy substrate is generally used as the substrate 101. An interconnect pattern is formed of copper or the like on the substrate 101 so that a desired circuit is formed. The interconnect pattern is mechanically connected with the interconnect pattern of the semiconductor device 100, or electrically connected with the interconnect pattern of the semiconductor device 100 using an anisotropic conductive film as described above.

Figure 10:
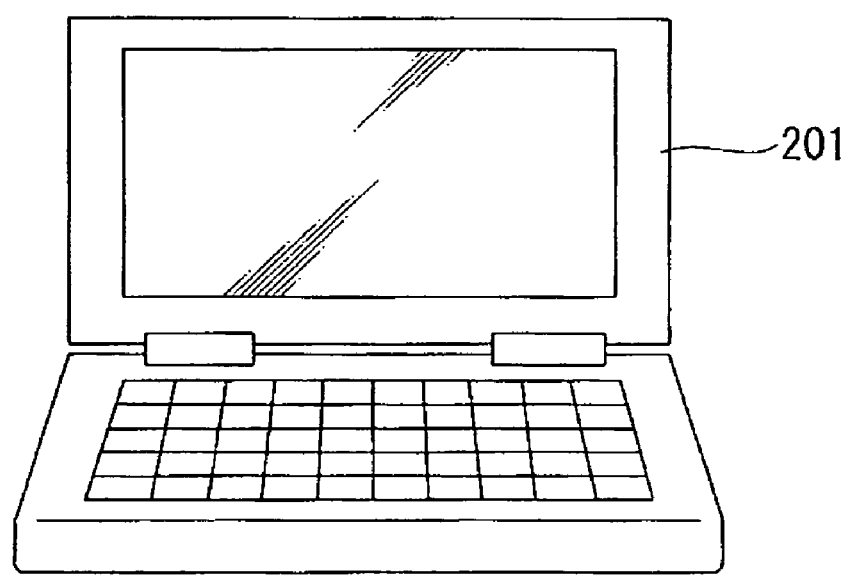
FIG. 10 shows a schematic configuration of an embodiment of an electronic instrument.

FIG. 10 shows a notebook-type personal computer 201 as an electronic instrument including the circuit board including the semiconductor device of the present embodiment. The circuit board shown in FIG. 9 is disposed in the casing of the electronic instrument.

The electronic instrument is not limited to the notebook-type computer and the portable telephone. The circuit board may be applied to various electronic instruments. For example, the circuit board may be applied to an electronic instrument such as a liquid crystal projector, multimedia personal computer (PC) and engineering workstation (EWS), pager, word processor, television, view finder or direct view finder video tape recorder, electronic notebook, electronic desk calculator, car navigation system, POS terminal, and a device including a touch panel.

What is claimed is:

1. A method of manufacturing a three-dimensional stacking type semiconductor device, comprising:

forming an electrode layer on each of a plurality of substrates, the electrode layer having a plurality of conductive layers with an insulating layer interposed between at least two adjacent conductive layers of the plurality of conductive layers, each of the at least two adjacent conductive layers being lower than an uppermost conductive layer and having a through-hole formed therein, the through-hole being filled with an insulating material;

forming a hole in the uppermost conductive layer coaxially with the through-hole in each of the at least two adjacent conductive layers, and forming an electrode layer through-hole in the electrode layer by etching the insulating material;

forming a substrate through-hole connected with the electrode layer through-hole in each of the substrates;

filling the electrode layer through-hole and the substrate through-hole in each of the substrates with a conductive member; and stacking the substrates by using the conductive member of each of the substrates.

* * * * *